(12) United States Patent
Broeckmann et al.

(10) Patent No.: US 11,500,032 B2
(45) Date of Patent: Nov. 15, 2022

(54) ELECTRIC MEASURING ASSEMBLY AND A METHOD FOR CONTINUOUSLY MONITORING A PROTECTIVE-CONDUCTOR RESISTANCE

(71) Applicant: Bender GmbH & Co. KG, Gruenberg (DE)

(72) Inventors: Eckhard Broeckmann, Giessen (DE); Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 17/470,536

(22) Filed: Sep. 9, 2021

(65) Prior Publication Data

US 2022/0082635 A1 Mar. 17, 2022

(30) Foreign Application Priority Data

Sep. 16, 2020 (DE) ...................... 10 2020 124 143.7

(51) Int. Cl.
*G01R 31/40* (2020.01)
*G01R 15/18* (2006.01)

(52) U.S. Cl.
CPC .............. *G01R 31/40* (2013.01); *G01R 15/18* (2013.01)

(58) Field of Classification Search
CPC ........ G01R 31/40; G01R 15/18; G01R 31/52; G01R 27/18
USPC .................................... 324/764.01, 537, 500
See application file for complete search history.

(56) References Cited

U.S. PATENT DOCUMENTS

| 2013/0191059 A1 | 7/2013 | Legros | |
|---|---|---|---|
| 2018/0205214 A1* | 7/2018 | Seidler | ................. G01R 19/165 |
| 2020/0235562 A1* | 7/2020 | Morich | ............. G01R 31/3277 |
| 2021/0255225 A1* | 8/2021 | Broeckmann | .......... G01R 31/54 |

FOREIGN PATENT DOCUMENTS

| DE | 102015218764 A1 | 6/2016 |
|---|---|---|
| DE | 102017213357 B3 | 10/2018 |
| DE | 102020102726 B3 | 3/2021 |

* cited by examiner

*Primary Examiner* — Giovanni Astacio-Oquendo
(74) *Attorney, Agent, or Firm* — Andrew D. Dorisio; Dickinson Wright PLLC

(57) ABSTRACT

An electric measuring assembly and a method for continuously monitoring a protective-conductor resistance of a protective-conductor connection in a power supply system having a supply station, a supply line, and an electric installation, grounded via the connection. A signal generator generates a signal alternating voltage having a measuring frequency; a first transformer encircles the connection and a first winding inductively couples the voltage into the connection so a loop current flows via first and second leakage capacitors, the active conductors, and the connection, and a second winding for the second measurement of a protective-conductor voltage; a second transformer encircles the connection and has a secondary winding capturing a protective-conductor current flowing in the connection; an evaluation unit determines a loop impedance from the protective-conductor voltage and the protective-conductor current for evaluating the real part of the loop impedance.

8 Claims, 2 Drawing Sheets

State of the Art

ELECTRIC MEASURING ASSEMBLY AND A METHOD FOR CONTINUOUSLY MONITORING A PROTECTIVE-CONDUCTOR RESISTANCE

This application claims priority to German Patent Application No. 10 2020 124 143.7 filed on Sep. 16, 2021, the disclosure of which is incorporated herein by reference.

TECHNICAL FIELD

The invention relates to an electric measuring assembly and a method for continuously monitoring a protective-conductor resistance of a protective-conductor connection in a power supply system having a supply station, which comprises first leakage capacitors, having a supply line, which comprises active conductors, and having an electric installation, which is grounded via the protective-conductor connection and comprises second leakage capacitors and a load.

BACKGROUND

In the scope of the protective measure "automated switching-off of the power supply" mandated for electric installations, a sufficiently high current flow in the part of the installation to be monitored is a prerequisite so that installed overcurrent protection devices can initiate a trip order fast enough. In a grounded power supply system (TN system, TN network), this comes to fruition in the instance of the first fault; in an ungrounded power supply system (IT system, IT network), this comes to fruition in the instance of the second fault. It must therefore be ensured that the impedance (loop impedance) of a loop current, which is generated by the supply station via the active conductors of a supply line to the load and back via the protective-conductor connection, has a low impedance to cause a sufficiently high loop current as a tripping current.

Standard IEC61557-3: 2007 stipulates specific requirements to measuring devices for measuring the loop impedance, the measurement being conducted by means of lowering the network voltage by loading the network. In practice, however, this measuring method appears to be suitable only for cyclic testing but not for continuously monitoring the loop resistance during active operation. In particular, this measuring method cannot be applied for IT systems since in IT systems, a fault having a negligible impedance at an active conductor already has to be switched to ground for measuring the loop impedance to form the measuring loop described. With a first fault having a negligible impedance, however, existing network leakage capacitances are instantaneously unloaded. In extensive IT networks having correspondingly large network leakage capacitances, this can lead to electric arcs and high leakage currents. Hence, determining the loop impedance in an IT system by means of the loop current is not without danger and means an additional load for the electric installation.

The state of the art therefore discloses other devices for measuring loops while feeding a measuring signal, which are equipped with a pilot line—also referred to as a control or test line—as a measuring current return line.

The pilot line is connected to the protective conductor on the side of the load. Thus, the loop resistance of the pilot line and the protective-conductor connection including the contact resistances of a plug connection can be detected using a simple resistance measurement in the supply station.

DE 10 2017 213 357 B3, for instance, describes a method having a pulsating activation of a measuring signal on the control line. If either the control line or the protective-conductor connection or if even both reach a high impedance via a defect, then this fault can be easily detected.

At the same time, the necessity of the pilot line brings with it the disadvantage that only specific supply lines can be used which contain a pilot line. It is not possible to add the option of monitoring in retrospect if already installed supply lines which do not contain a pilot line are to be used.

Other suggestions from the state of the art are based on naturally existing multiple groundings or on consciously created multiple groundings functioning as a pilot line.

Specification DE 10 2015 218 764 A1 describes a method for the shore connection of ships at harbors, a measuring signal being inductively coupled into the protective-conductor connection in this method. For forming a current loop, the method makes use of the fact that multiple groundings are available via electrically conductive salt water or a metallic gangway are available. Determining the loop impedance and thus the protective-conductor resistance, however, is impeded, since returning the measuring current via the gangway can fail if the gangway is set on insulated ground. Moreover, the electric resistance of the returning measuring current can only be registered with difficulty and imprecisely via electrically conductive salt water.

Another method is described in Specification US 2013/0191059 A1, in which a measuring signal is inductively inducted into the protective-conductor connection at a frequency of approximately 2 kHz. The impressed measuring current is returned via the soil whose resistance is deemed to have a low impedance and is to be seen as mostly ohmic. From the perspective of measuring technology, the soil as measuring current return line thus corresponds to a naturally existing pilot line in conjunction with the disadvantages of a quantitatively unreliable designation of the electric resistance of the soil.

SUMMARY

The object of the invention at hand is therefore to propose a method and a device for continuously monitoring a protective-conductor resistance of a protective-conductor connection in a power supply system, which do not require any additional installation of a pilot line, control line or test line, prevent imprecisions when registering measured values, allow a time-continuous monitoring, and are suitable for grounded as well as ungrounded power supply systems.

The baseline for these observations and thus the requirements for the system environment for applying the invention is a power supply system having a supply station, which comprises first leakage capacitors, typically filter capacitors for radio interference suppression, which are switched between respective active conductors of a supply line and the protective-conductor connection. Furthermore, an electric installation is presumed, which is grounded via the protective-conductor connection and likewise comprises second leakage capacitors. A load disposed in the electric installation is connected to the supply station of the power supply system via the active conductors of the supply line according to requirements.

As intended by the invention, the supply station comprises a signal generator for generating a signal alternating current having a certain measuring frequency. To prevent EMC interferences, the signal alternating voltage is preferably sine-shaped and is preferably made available by the signal generator via analog-digital conversion, followed by an amplifier. The signal generator is controlled by a digital computing unit, which is disposed in an evaluation unit and is preferably realized as a microcontroller.

According to the invention, a first measuring current transformer having a first winding, which encircles the protective-conductor connection and serves for inductively coupling the signal alternating voltage into the protective-conductor connection, is disposed in the supply station. This results in a current loop, in which a loop current caused by the impressed signal alternating voltage flows, via the first leakage capacitors in the supply station, the active conductors of the supply line, the second leakage capacitors in the electric installation and via the protective-conductor connection.

Since a complex-valued loop impedance is measured based on the electric variables measured at the protective conductor, the first measuring current transformer comprises a second winding, which also encircles the protective-conductor connection, for measuring for a second time a protective-conductor voltage.

The electric measuring assembly further comprises a second measuring current transformer having a secondary winding for registering a protective-conductor current flowing in the protective-conductor connection.

In addition to controlling the signal generator, an evaluation unit having a digital computing unit also serves in the electric measuring assembly for determining a loop impedance from the protective-conductor voltage and the protective-conductor current and for evaluating the real part of the loop impedance.

The fundamental idea of the invention consists of the leakage capacitors, which are disposed in the supply station and the electric installation, respectively, enabling a loop current, which flows via the active conductors and the protective-conductor connection when the measuring frequency of the coupled signal alternating voltage is sufficiently high. Hence, the active conductors of the supply line are used as a pilot line as intended by the invention. The active conductors of the supply line thus constitute part of the loop and replace the complicated installation of a pilot line. Nevertheless, the active conductors of the supply line display the same high measuring accuracy as an installed pilot line with regard to determining the loop impedance. With regard to measuring accuracy, the electric measuring assembly according to the invention and the method according to the invention based thereon are thus superior to hitherto known methods, which are based on measuring current return line by means of multiple groundings switched parallel.

Moreover, the invention can be used in grounded as well as ungrounded power supply systems pursuant to the requirement of the system environment mentioned above, the measuring quality of a measuring assembly comprising a pilot line being attained without a pilot line actually being present.

Advantageously, the measuring frequency (fs) of the signal alternating voltage (Us) is in the range of 100 kHz.

By choosing this measuring frequency of approximately 100 kHz, which is multiple times higher compared to a network frequency of, for example, 50 Hz, the sensitivity to faults caused by distortions of the network voltage or non-harmonic network currents are significantly reduced since the measuring frequency is around the $2.000^{th}$ harmonic of the network frequency. Moreover, the electric resistance of the leakage capacitors takes on small values with the chosen measuring frequency, which leads to a high loop current (which corresponds to the measured protective-conductor current, except for a negligible deviation) and to a high signal/noise ratio.

Furthermore, the electric measuring assembly comprises a high-pass circuit for filtering the protective-conductor current. The high-pass circuit is preferably realized as an analogous RC element and separates the desired protective-conductor current having high frequency from interferences having low frequency.

Advantageously, the evaluation unit comprises an analog-digital converter for analog-digital converting the protective-conductor voltage and the protective-conductor current.

Preferably, the measured protective-conductor voltage and the measured protective-conductor current is further processed using methods from digital signal processing after having been analog-digital converted.

The described electric measuring assembly according to the invention is based on the technical teachings described in the independent method claim. In this respect, the technical effects mentioned above and the advantages gathered therefrom apply to the method features.

In particular, it is to be emphasized that in addition to the protective-conductor connection, the available leakage capacitors as well as the active conductors of the supply line constitute part of the measuring loop when using measuring frequency which are multiple times higher than the network frequency. Therefore, by using the active conductors of the supply line like a pilot line, an actual pilot line is no longer required, while the same measuring accuracy is attained as if a pilot line is being used.

BRIEF DESCRIPTION OF THE DRAWINGS

Further advantageous embodiment features are derived from the following descriptions and the drawings, which describe a preferred embodiment of the invention using examples.

DETAILED DESCRIPTION

Figure 1:
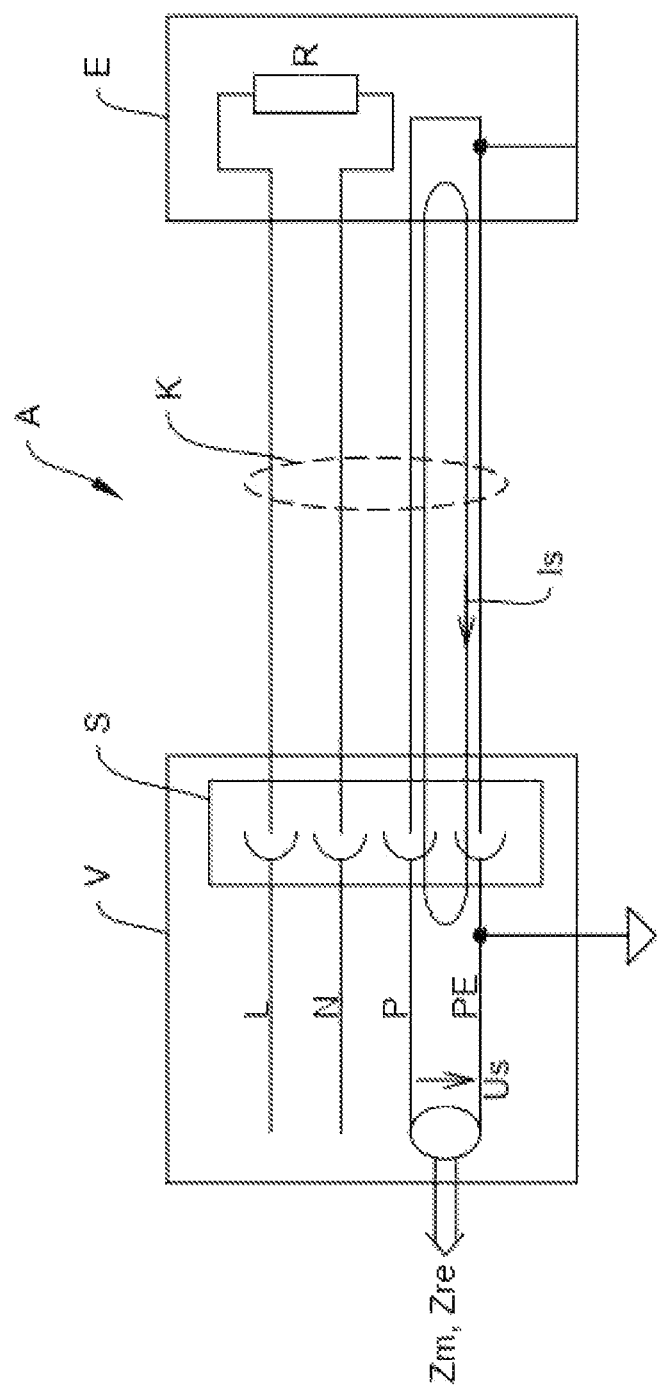
FIG. 1 shows a measurement of the loop impedance having a pilot line according to the state of the art.

FIG. 1 shows a measurement of the loop impedance Zm in a TN system A having a pilot line P, as disclosed by the state of the art.

A supply station V is connected to electric installation E via a supply line K. Supply line K comprises an additional pilot line P besides active conductors L and N and protective-conductor connection PE. In electric installation E, pilot line P is connected to protective-conductor connection PE so that a current loop arises, in which a loop current Is flows when a signal alternating voltage Us is applied between pilot line P and protective-conductor connection PE in supply station V. Thus, loop impedance Zm of pilot line P and protective-conductor connection PE including the contact resistances of a possibly existing plug connection S can be detected using a simple resistance measurement in supply station V.

Figure 2:
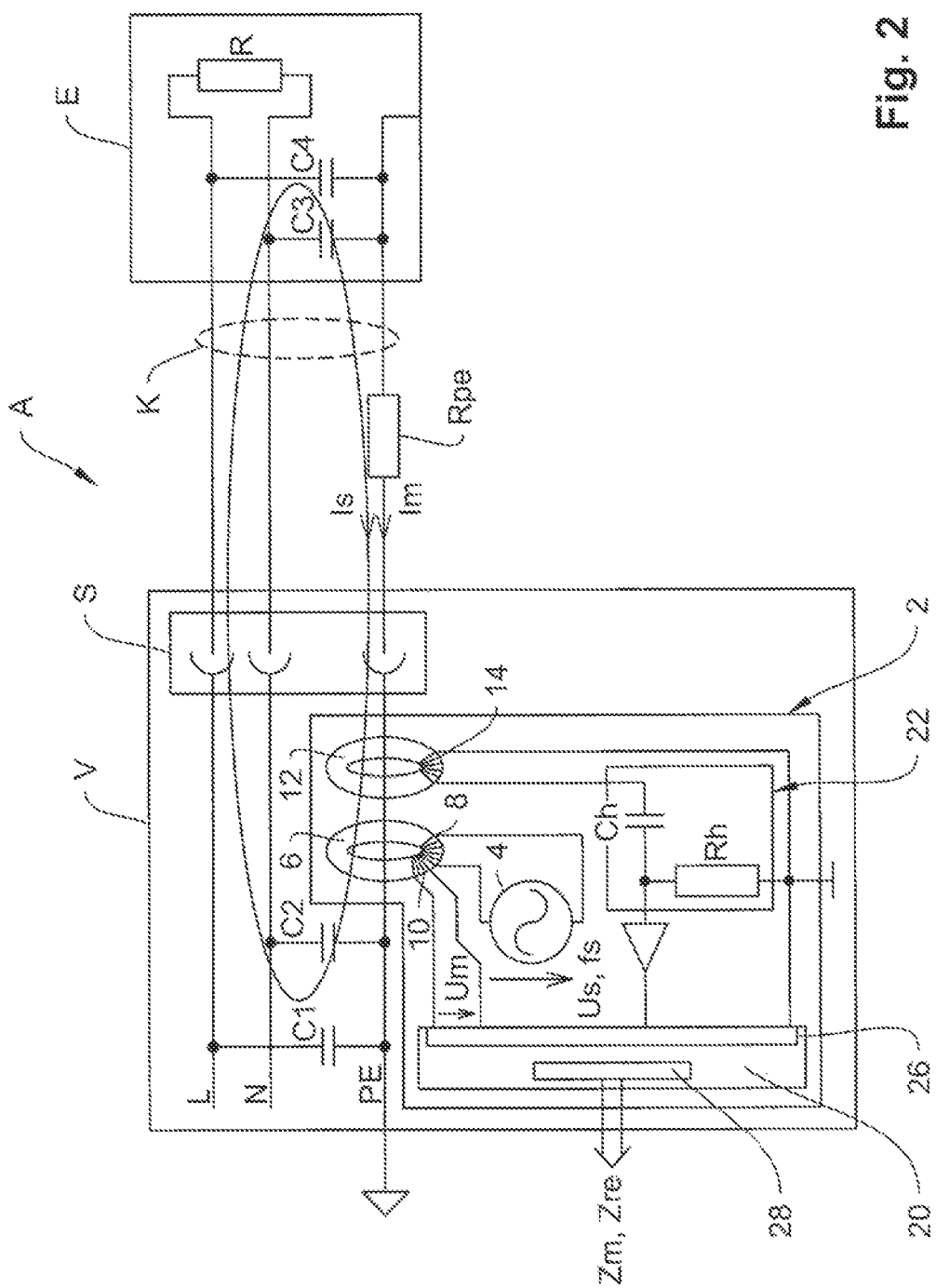
FIG. 2 shows an electric measuring assembly according to the invention.

FIG. 2 shows a measuring assembly 2 according to the invention located in a supply station V in TN system A. Supply station V is connected to an electric installation E, which comprises a load R, via a supply line K consisting of active conductors L and N, the protective-conductor connection PE and, if applicable, via a plug connection S.

Both supply station V and electric installation E comprise first leakage capacitors C1, C2 and second leakage capacitors C3, C4, respectively, starting from active conductors L, N to protective-conductor connection PE.

In this presumed system environment, electric measuring assembly 2 according to the invention is disposed in supply station V. Electric measuring assembly 2 comprises a signal generator 4 for generating a signal alternating voltage Us having a measuring frequency fs.

Electric measuring assembly 2 further comprises a first measuring current transformer 6, which encircles protective-conductor connection PE and comprises a first winding 8 for inductively coupling alternating signal voltage Us into protective-conductor connection PE. First measuring current transformer 6 can be designed as a toroid, through which protective-conductor connection PE is guided.

Thus, a current loop is obtained for an alternating current, the current loop being made up of: the parallel circuit of leakage capacitors C1 and C2 in supply station V; the parallel circuit of active conductors L and N of supply line K—if applicable having contact resistances of plug connection S; the parallel circuit of leakage capacitors C3 and C4 in electric installation E and protective-conductor connection PE—if applicable having the corresponding contact resistance of respective plug connection S.

First measuring current transformer 6 is equipped with a second winding 10 for measuring for a second time a protective-conductor voltage Um. Second winding 10 is loaded with a high impedance and generates protective-conductor voltage Um, which is fed to an analog-digital converter 26 for further processing in a computer, such as a digital computing unit 28 of evaluation unit 20.

Electric measuring assembly 2 further comprises a second measuring current transformer 12, which encircles protective-conductor connection PE and comprises a secondary winding 14 for detecting a protective-conductor current Im flowing in protective-conductor connection PE. Second measuring current transformer 12 is operated as a current transformer, i.e., it is generally provided with a low-impedance termination. Second measuring current transformer 12 is also designed as a toroid, through which protective-conductor connection PE is guided.

Via an analogous high-pass circuit 22, which consists of a capacitor Ch and an ohmic resistance Rh, protective-conductor current Im detected by secondary winding 14 is fed to evaluation unit 20 via an amplifier. The threshold frequency of high-pass circuit 22 measured in such a manner that the network frequency and, if applicable, arising interfering components are sufficiently suppressed below measuring frequency fs.

In digital computing unit 28, loop impedance Zm is determined from protective-conductor voltage Um and protective-conductor current Im. In this context, the impedance is computed in such a manner that the real part and the imaginary part of loop impedance Zm can be represented separately. Preferably, numerical methods for computing Fourier coefficients are applied in digital computing unit 28 after analog-digital conversion 26.

The imaginary part of loop impedance Zm calculated in this manner is only obtained by the effect of the leakage capacitors having the purely imaginary impedance $Zc=1/j\omega C$. Real part Zre of loop impedance Zm of the current loop consists of the following parts: the equivalent series resistance (ESR) of the parallel circuit of leakage capacitors C1 and C2; the ohmic resistance of the parallel circuit of active conductors L and N of supply line K—if applicable having the contact resistances of respective plug connection S; the equivalent series resistance (ESR) of the parallel circuit of leakage capacitors C3 and C4; and the ohmic resistance of protective-conductor connection PE—if applicable having the respective contact resistance.

The ESR values of the leakage capacitors for the most part are so small that they can be neglected. It is discernable that ohmic resistance Rpe of protective-conductor connection PE—if applicable having the respective contact resistance—cannot be measured separately as a component of the measuring loop. This, however, does not carry with it a disadvantage, since the ohmic resistance of the parallel circuit of active conductor L and N of supply line K also always results in a negligible value. Thus, real part Zre of loop impedance Zm approximately corresponds to protective-conductor resistance Rpe to be monitored. Should a value fall short of a protective-conductor-resistance threshold value, a suitable warning can be emitted, which is either optical and/or acoustic.

The invention claimed is:

1. An electric measuring assembly (2) for continuously monitoring a protective-conductor resistance (Rpe) of a protective-conductor connection (PE) in a power supply system (A) comprising a supply station (V), which comprises first leakage capacitors (C1, C2), comprising a supply line (K), which comprises active conductors (L, N), and comprising an electric installation (E), which is grounded via the protective-conductor connection (PE) and comprises second leakage capacitors (C3, C4) and a load (R), the electric measuring assembly (2) comprising
   a signal generator (4) for generating a signal alternating voltage (Us) having a measuring frequency (fs),
   a first measuring current transformer (6), which encircles the protective-conductor connection (PE) and has a first winding (8) for inductively coupling the signal alternating voltage (Us) into the protective-conductor connection (PE) so that a loop current (Is) flows via the first leakage capacitors (C1, C2), the active conductors (L, N), the second leakage capacitors (C3, C4) and the protective-conductor connection (PE), and has a second winding (10) for the second measurement of a protective-conductor voltage (Um), a second measuring current transformer (12), which encircles the protective-conductor connection (PE) and has a secondary winding (14) for capturing a protective-conductor current (Im) flowing in the protective-conductor connection (PE),
   an evaluation unit (20) having a digital computing unit (28) for controlling the signal generator (4), for determining a loop impedance (Zm) from the protective-conductor voltage (Um) and the protective-conductor current (Im) and for evaluating the real part (Zre) of the loop impedance (Zm).

2. The electric measuring assembly (2) according to claim 1, wherein the measuring frequency (fs) of the signal alternating voltage (Us) is in the range of 100 kHz.

3. The electric measuring assembly (2) according to claim 1, wherein a high-pass circuit (22) for filtering the protective-conductor current (Im).

4. The electric measuring assembly (2) according to claim 1, wherein the evaluation unit (20) comprises analog-digital converters (26) for analog-digital converting the protective-conductor voltage (Um) and the protective-conductor current (Im).

5. A method for continuously monitoring a protective-conductor resistance of a protective-conductor connection (PE) in a power supply system (A) having a supply station (V), which comprises first leakage capacitors (C1, C2), the power supply system comprising a supply line (K), which comprises active conductors (L, N), and comprising an electric installation (E), which is grounded via protective-conductor connection (PE) and comprises second leakage capacitors (C3, C4) and a load (R), the method comprising the following steps:

generating a signal alternating voltage (Us) having a measuring frequency (fs) by means of a signal generator (4), inductively coupling the signal alternating voltage (Us) into the protective-conductor connection (PE) by means of a first measuring current transformer (6), which encircles the protective-conductor connection (PE) and has a first winding (8), so that a loop current (Is) flows via the first leakage capacitors (C1, C2), the active conductors (L, N) of the supply line (K), the second leakage capacitors (C3, C4) and the protective-conductor connection (PE), conducting a return measurement of a protective-conductor voltage (Um) for the second time using a second winding (10) of the first measuring current transformer (6), capturing a protective-conductor current (Im), which flows in the protective-conductor connection (PE), by means of a second measuring current transformer (12), which encircles the protective-conductor connection (PE) and has a secondary winding (14), and controlling the signal generator (4), determining a loop impedance (Zm) from the protective-conductor voltage (Um) and the protective-conductor current (Im), and evaluating the real part (Zre) of the loop impedance (Zm) by means of a digital computing unit (28) in an evaluation unit (20) disposed in the supply station (V).

6. The method according to claim 5, wherein the measuring frequency (fs) is in the range of 100 kHz.

7. The method according to claim 5, wherein filtering the protective-conductor current (Im) is by means of a high-pass circuit (22).

8. The method according to claim 5, further including analog-digital converting (26) the protective-conductor voltage (Um) and the protective-conductor current (Im).

* * * * *